United States Patent [19]
Kamon

[11] Patent Number: 5,173,380
[45] Date of Patent: Dec. 22, 1992

[54] PHOTOMASK

[75] Inventor: Kazuya Kamon, Itami, Japan

[73] Assignee: Mitsubishi Denki Kabushiki Kaisha, Tokyo, Japan

[21] Appl. No.: 654,057

[22] Filed: Feb. 12, 1991

[30] Foreign Application Priority Data

Jul. 5, 1990 [JP] Japan .................................. 2-180103

[51] Int. Cl.$^5$ .............................................. G03F 9/00
[52] U.S. Cl. ........................................ 430/5; 428/131
[58] Field of Search ............................. 430/5; 428/131

[56] References Cited

U.S. PATENT DOCUMENTS

| 4,764,441 | 8/1988 | Ohta et al. | 430/5 |
| 4,873,163 | 10/1989 | Watakabe et al. | 430/5 |
| 4,923,772 | 5/1990 | Kirch et al. | 430/5 |
| 5,045,417 | 9/1991 | Okamoto | 430/5 |

FOREIGN PATENT DOCUMENTS

| 0121441 | 9/1980 | Japan | 430/5 |
| 0110939 | 9/1981 | Japan | 430/5 |
| 0167025 | 10/1982 | Japan | 430/5 |
| 62-67514 | 3/1987 | Japan . | |
| 0214859 | 8/1989 | Japan | 430/5 |

Primary Examiner—Marion E. McCamish
Assistant Examiner—Mark A. Chapman
Attorney, Agent, or Firm—Oblon, Spivak, McClelland, Maier & Neustadt

[57] ABSTRACT

In a photomask, a first and a second rectangular openings are formed in a shield layer which provided on a transparent plate. The first rectangular opening is disposed so as to deviate off normal lines of respective sides of the second rectangular opening. Thus, no diffraction images of the first and the second rectangular openings overlap zero-order diffraction images of the second and the first rectangular openings, respectively.

8 Claims, 7 Drawing Sheets

PHOTOMASK

BACKGROUND OF THE INVENTION

1. Field of the Invention

The present invention relates to a photomask used in a photolithography process which is one of the manufacturing processes of a semiconductor device.

2. Description of the Background Art

A lithography technique is usually used for forming a circuit pattern to be provided on a semiconductor device. This technique fundamentally consists of a coating step for coating a substrate such as wafer with photoresist to form a photoresist layer, an exposure step for impinging light (for example, light in an ultraviolet region) from a suitable light source upon a photomask having a predetermined pattern to transfer the pattern to the photoresist layer and a development step for developing the photoresist layer to obtain a photoresist layer having the predetermined pattern.

Figure 1:
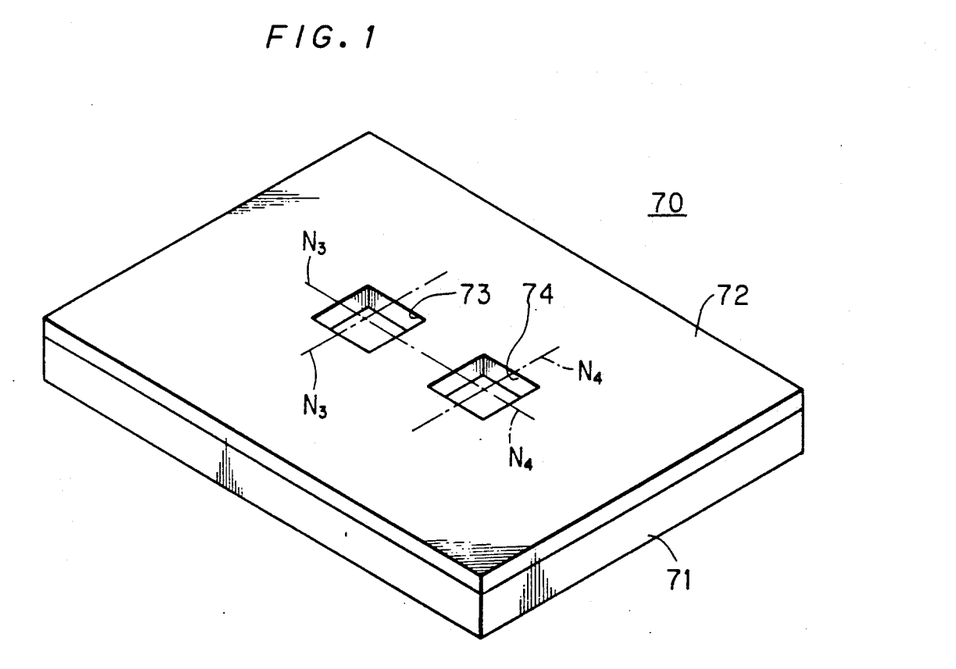
FIG. 1 is a perspective view of a conventional photomask.

FIG. 1 is a perspective view of a conventional photomask 70 used in the exposure step. In FIG. 1, numeral 71 represents a glass substrate, on which a shield layer 72 of chromium is formed. The shield layer 72 is provided with two adjacent rectagular light-transmission patterns 73 and 74 formed by rectangular openings in parallel. In addition, the term "rectangular" means a shape including a square and a oblong.

Figure 2:
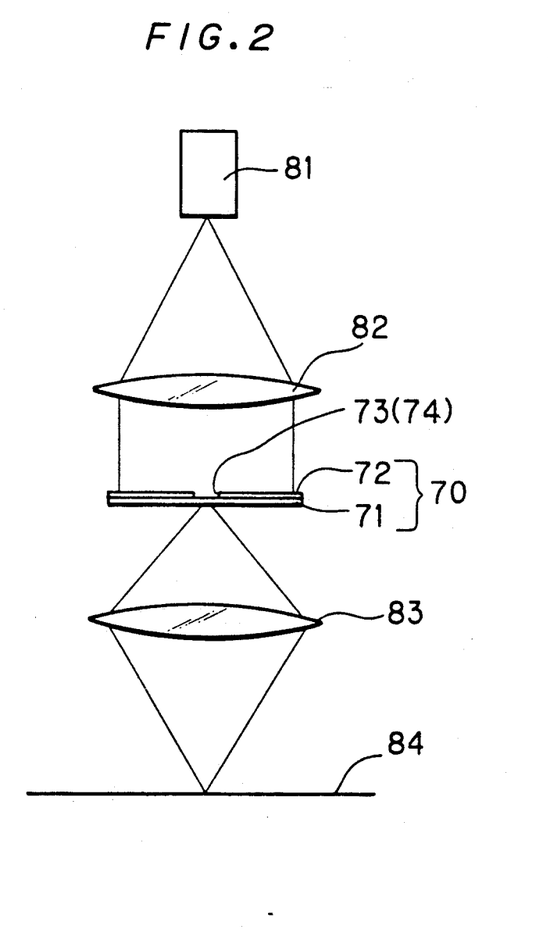
FIG. 2 is a schematical structural view of an exposure device.

FIG. 2 is a schematic structural view of an exposure device. As shown in FIG. 2, the exposure device is provided with a light source 81 for emitting light in an ultraviolet region downwardly. The light from the light source 81 is directed through a lens 82 to the photomask 70. Some of the incident light passes through the rectangular light-transmission patterns 73 and 74, further to be introduced through a lens 83 onto a photoresist surface 84. On the other hand, the light impinging upon the shield layer 72 is shielded by the shield layer 72. Thus, exposure patterns corresponding to the rectangular light-transmission patterns 73 and 74 are transferred to the photoresist surface 84.

As in FIG. 1, the rectangular light-transmission patterns 73 and 74 are adjacent to each other; More particularly, one rectangular light-transmission pattern 74 (or 73) is disposed on the normal lines $N_3$ (or $N_4$) of the other rectangular light-transmission pattern 73 (or 74). When the exposure process is carried out with the photomask 70, diffraction light from the rectangular light-transmission pattern 73 (or 74) exerts adverse effect on the form of the transferred pattern which is formed by focusing diffraction light from the rectangular light-transmission pattern 74 (or 73) on the photoresist surface 84; in brief, the patterns transferred on the photoresist surface 84 are deformed by the diffraction light. The closer the rectangular light-transmission patterns 73 and 74 are in proximity to each other, the larger the deformation grows. The deformation causes the deterioration of transfer accuracy of the pattern to the photoresist surface 84. In particular, in these days of advancing high integration, the rectangular light-transmission patterns 73 and 74 are disposed in further closer proximity to each other. Accordingly, the influence of the diffraction light is a serious problem.

SUMMARY OF THE INVENTION

The present invention is directed to a photomask. The photomask comprises: a transparent plate; and a shield layer formed on the transparent plate, the shield layer having a first and a second rectangular openings each of which serves as a rectangular light-transmission pattern, wherein the first rectangular opening is disposed so as to deviate off normal lines of respective sides of said second rectangular opening.

Accordingly, an object of the present invention is to provide a photomask in which two exposure pattern adjacent to each other can be accurately transferred to an exposure surface.

These and other objects, features, aspects and advantages of the present invention will become more apparent from the following detailed description of the present invention when taken in conjunction with the accompanying drawings.

DESCRIPTION OF THE PREFERRED EMBODIMENTS

Prior to explaining a preferred embodiment of a photomask according to the present invention, the cause why the above-mentioned problem is generated will be examined.

First, considered is the case where a single rectangular light-transmission pattern is formed on a photomask.

Figure 3:
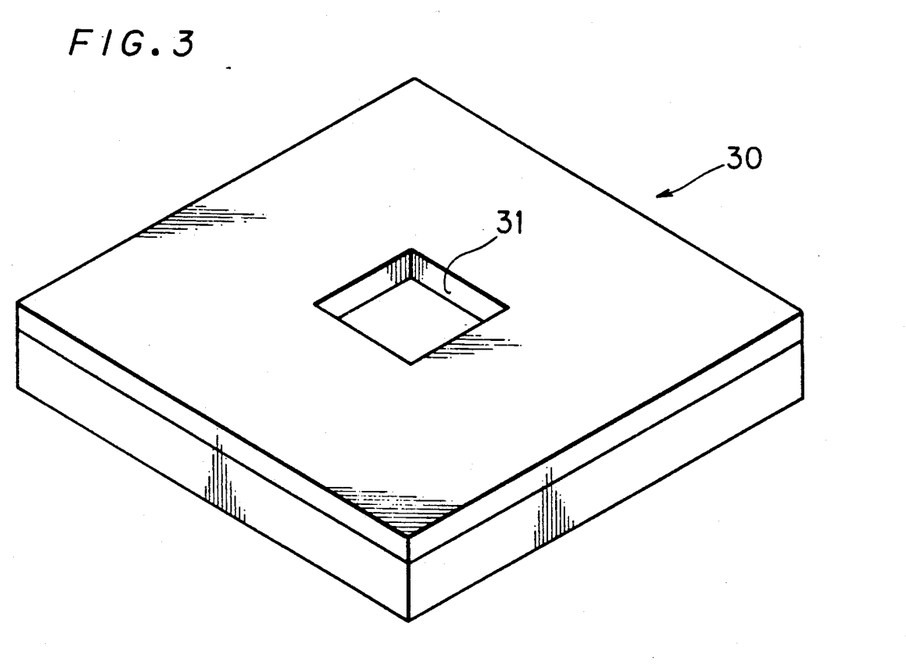
FIG. 3 is a perspective view of a photomask in which a single rectangular light-transmission pattern is formed.
Figure 4:
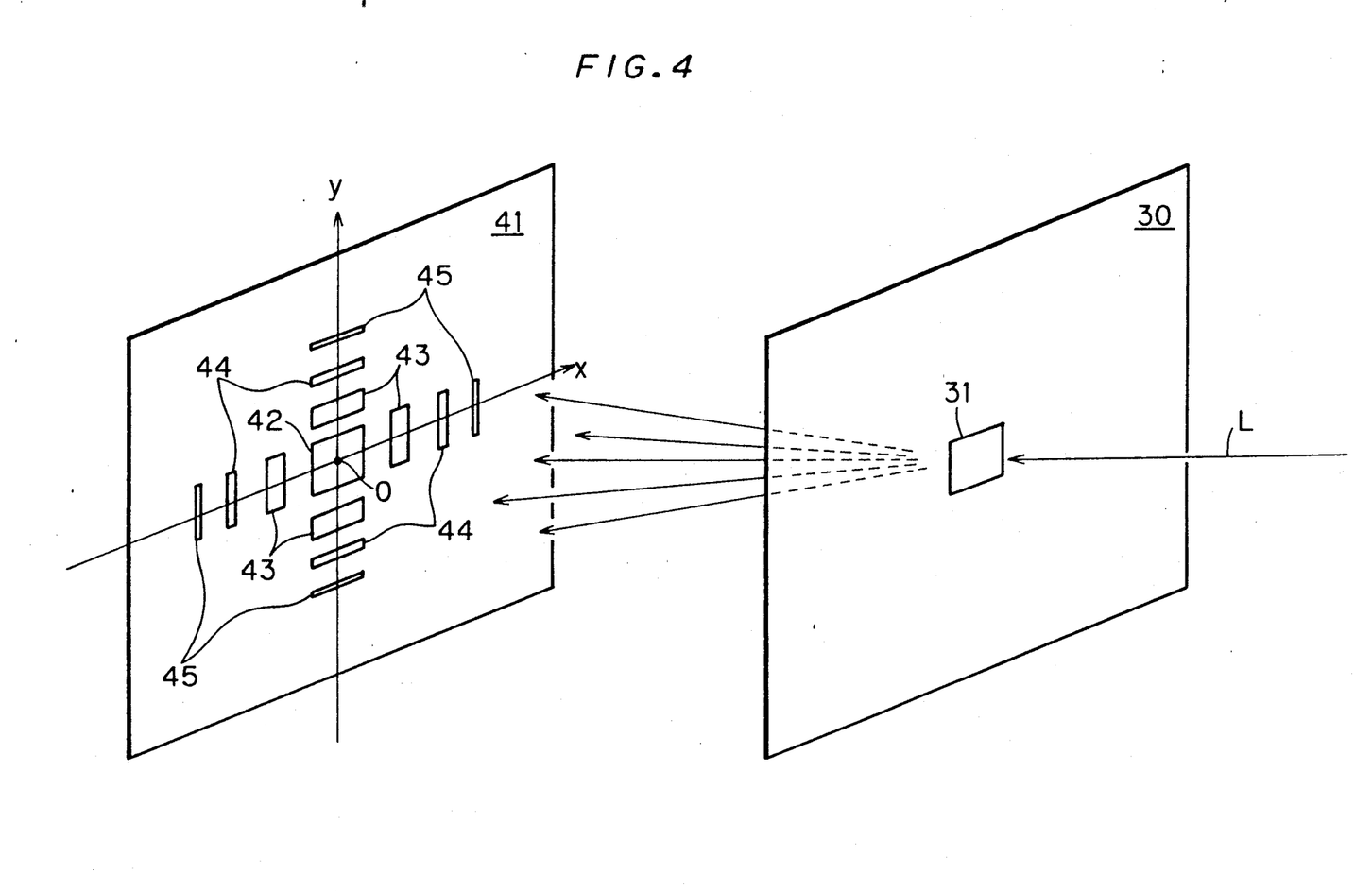
FIG. 4 schematically shows images formed on an exposure surface when parallel light is emitted vertically to the surface of the photomask.

FIG. 3 is a perspective view of a photomask 30 so formed. FIG. 4 schematically shows images transferred on an exposure surface 41 when parallel light L having uniform light intensity distribution is vertically impinged upon the surface of the photomask 30. In FIG. 4, the exposure surface 41 is disposed a predetermined distance apart from the photomask 30.

Figure 5:
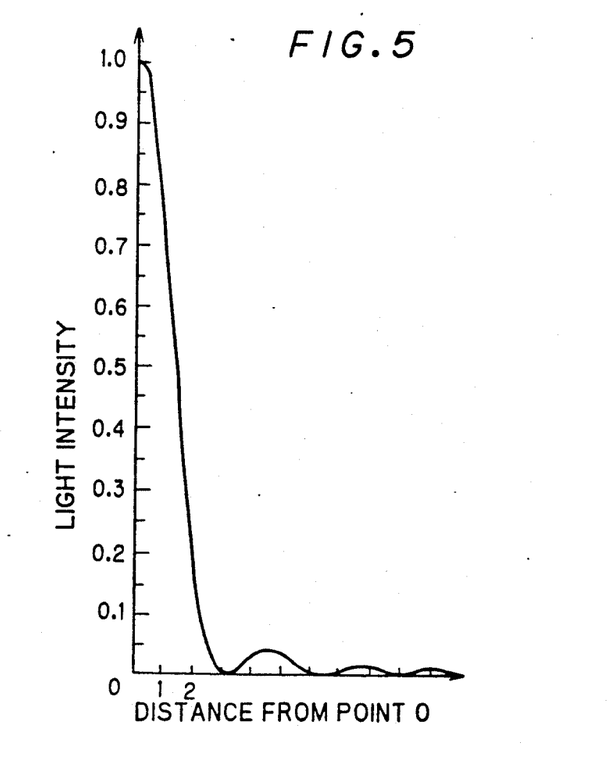
FIG. 5 is a graph showing a light intensity on the exposure surface.

FIG. 5 is a graph showing a light intensity in the x-direction of the exposure surface 41 of FIG. 4. In FIG. 5, the abscissa shows a distance from the point 0 (shown in FIG. 4) in the x-direction, and the ordinate shows a ratio of the light intensity as the light intensity at the point 0 is taken as "1". As will be understood from FIG. 5, peaks due to Fraunhofer diffraction are seen around the primary peak. Accordingly, not only a rectangular pattern 42 corresponding to a rectangular light-transmission pattern 31 but also superfluous diffraction images 43 to 45 are formed on the exposure surface 41.

In FIG. 4, the relatively brighter image 42 formed substantially at the center of the exposure surface 41 is a zero-order diffraction image. First-order diffraction images 43, second-order diffraction images 44 and third-order diffraction images 45 are formed in series from the image 42 in the directions normal to the respective sides of the rectangular light-transmission pattern 31, that is, in the x-direction and the y-direction of FIG. 4.

Figure 6:
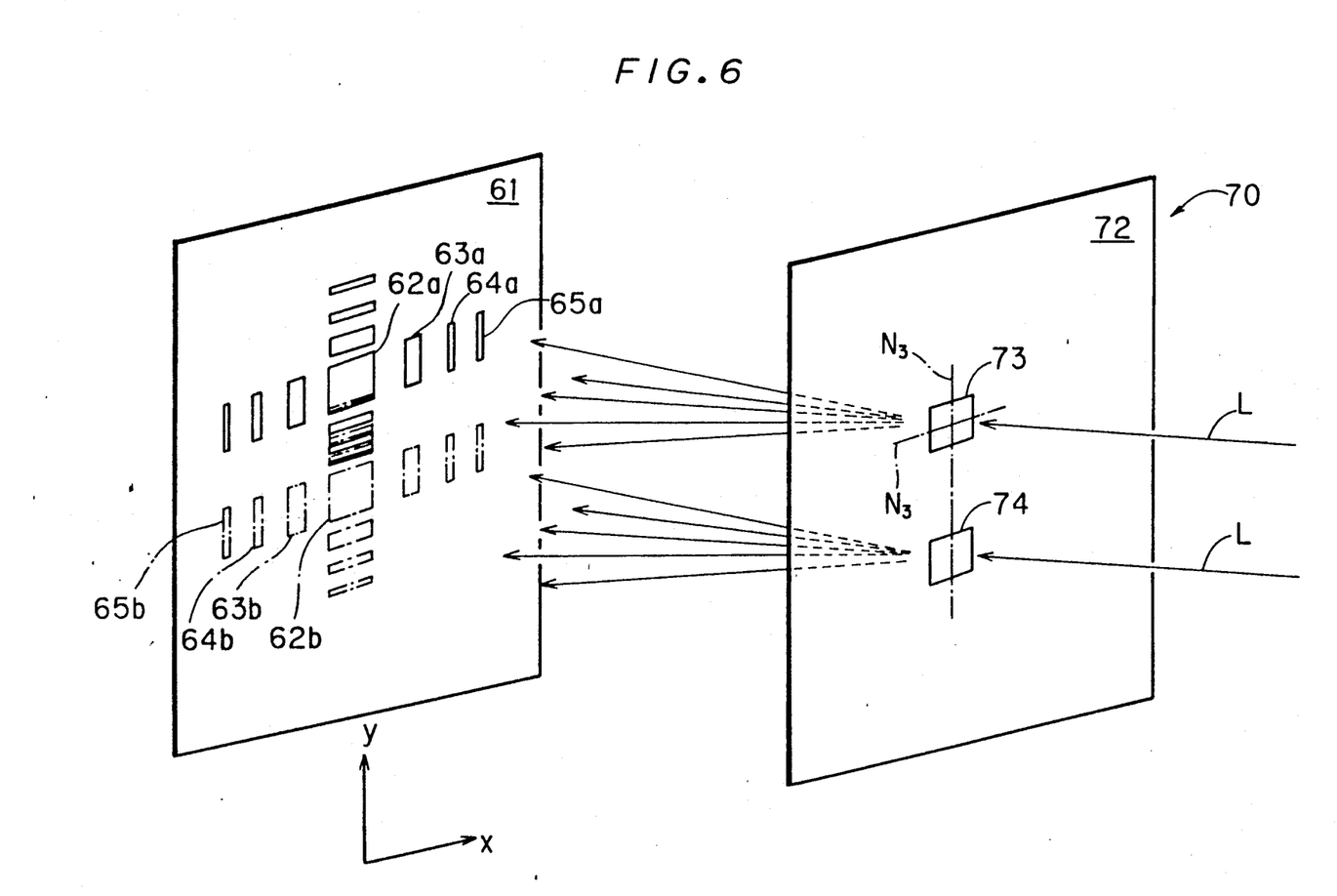
FIG. 6 shows images in the case of forming an exposure pattern on an exposure surface by the use of a conventional photomask.

Next, considered is the case where the parallel light L is vertically impinged upon the surface of the photomask 70 shown in FIG. 1. FIG. 6 schematically shows images formed on an exposure surface 61. In FIG. 6, the exposure surface 61 is disposed a predetermined distance apart from the photomask 70. For easy understanding, the diffraction images of the rectangular light-transmission pattern 73 are indicated by solid lines while those of the rectangular light-transmission pattern 74 are indicated by alternate dashed-and-dotted lines. As shown in FIG. 6, the diffraction images (indicated by solid lines) 62a, 63a, 64a and 65a of the rectangular light-transmission pattern 73 are the same as the diffraction images (in FIG. 4) in the case of impinging the parallel light to the single rectangular light-transmission pattern. Centered on the zero-order diffraction image 62a corresponding to the rectangular light-transmission pattern 73, the first-order diffraction images 63a, the second-order diffraction images 64a and the third-order diffraction images 65a are formed in series in the directions of the normal lines $N_3$ of the respective sides of the rectangular light-transmission pattern 73, that is, in the x-direction and the y-direction of FIG. 6. Also the diffraction images (indicated by alternate dashed-and-dotted lines) 62b, 63b, 64b and 65b of the rectangular light-transmission pattern 74 are formed on the exposure surface 61 in the same manner as the diffraction images (indicated by solid lines) 62a, 63a, 64a and 65a of the rectangular light-transmission pattern 73.

In the photomask 70, the rectangular light-transmission pattern 74 is formed on the normal line $N_3$ of the rectangular light-transmission pattern 73. Accordingly, the diffraction images 62a, 63a, 64a and 65a of the rectangular light-transmission pattern 73 and the diffraction images 62b, 63b, 64b and 65b of the rectangular light-transmission pattern 74, which are formed in the y-direction, overlap partially. As shown in FIG. 6, for example, the third-order diffraction image 65b of the rectangular light-transmission pattern 74 overlaps the zero-order diffraction image 62a of the rectangular light-transmission pattern 73, so that the image 62a is deformed. The zero-order diffraction image 62b of the rectangular light-transmission pattern 74 is also deformed due to the diffraction image of the other rectangular light-transmission pattern 73.

Figure 7:
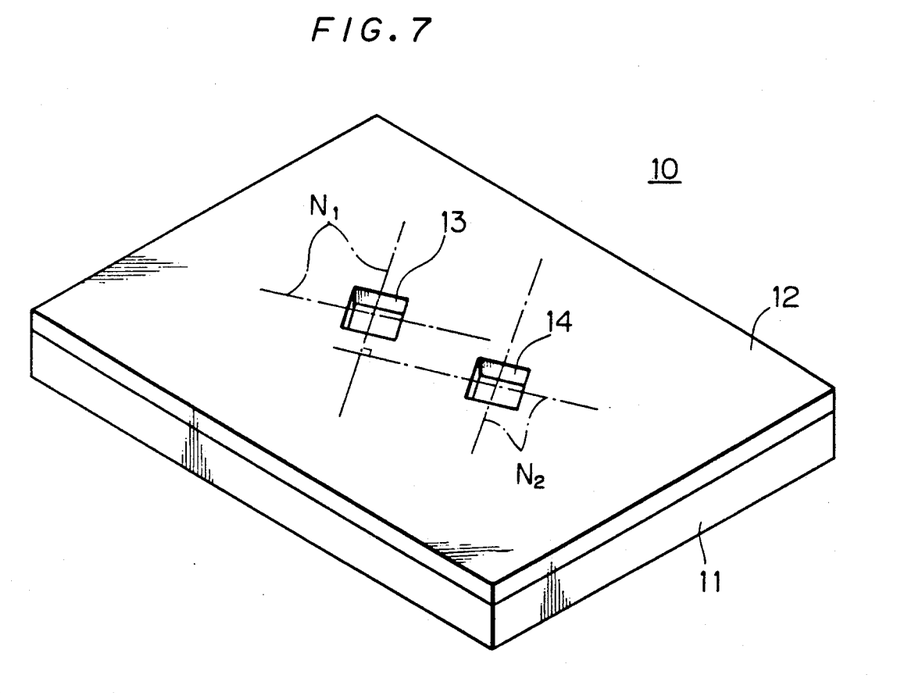
FIG. 7 is a perspective view of an embodiment of a photomask according to the present invention.

FIG. 7 is a perspective view of a preferred embodiment of a photomask according to the present invention. As shown in FIG. 7, a photomask 10 comprises a shield layer 12 formed on a glass substrate 11. The shield layer 12 has two rectangular openings each of which serves as a light-transmission patterns. The terms "rectangular light-transmissions 13 and 14" refer to the openings. The rectangular light-transmission pattern 14 is provided in a position deviating off the normal lines $N_1$ of the respective sides of the rectangular light-transmission pattern 13. Likewise, the rectangular light-transmission pattern 13 is provided in a position deviating off the normal lines $N_2$ of the respective sides of the rectangular light-transmission pattern 14. Assuming that the rectangular light-transmission patterns 13 and 14 of FIG. 1 are rotated by 45° around the vertical axis, the rotated rectangular light-transmission patterns coincide with the rectangular light-transmission patterns 13 and 14, respectively. Accordingly, the normal lines $N_1$ of the respective sides of the rectangular light-transmission pattern 13 and the normal lines $N_2$ of the respective sides of the rectangular light-transmission pattern 14 intersect at right angles.

Figure 8:
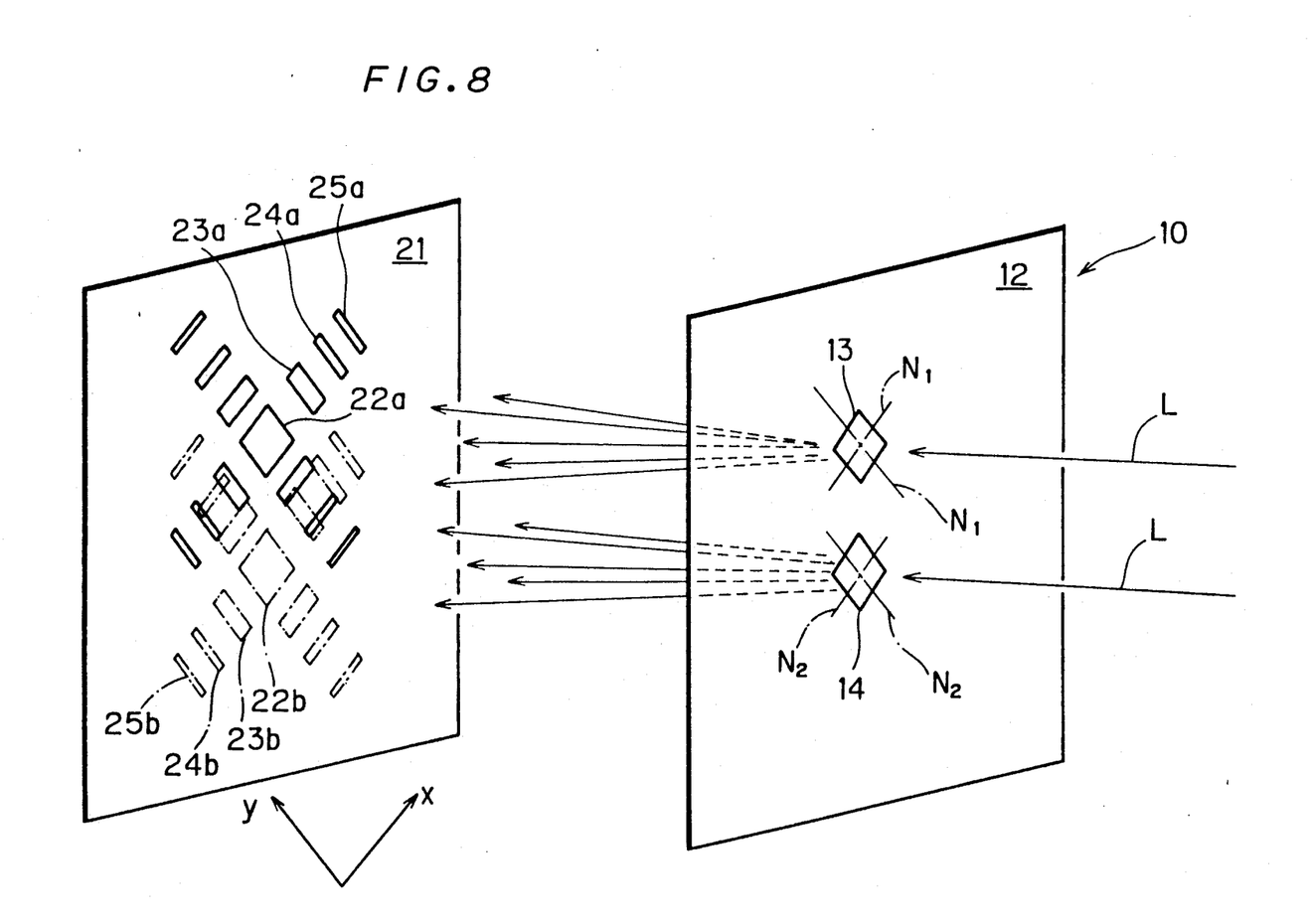
FIG. 8 schematically shows images formed on an exposure surface when parallel light is vertically impinged upon the surface of the photomask.

FIG. 8 shows typically images formed on an exposure surface 21 when parallel light L is vertically impinged upon the surface of the photomask 10. In FIG. 8, the exposure surface 21 is disposed a predetermined distance apart from the photomask 10. Similarly to the aforesaid case, for easy understanding in FIG. 8, diffraction images of the rectangular light-transmission pattern 13 are indicated by solid lines while diffraction images of the rectangular light-transmission pattern 14 are indicated by alternate dashed-and-dotted lines. As shown in FIG. 8, centered on a zero-order diffraction image 22a of the rectangular light-transmission pattern 13, first-order diffraction images 23a, second-order diffraction images 24a and third-order diffraction images 25a thereof are formed in series in the direction of the normal lines $N_1$ of the respective sides of the rectangular light-transmission pattern 13, that is, in the x-direction and the y-direction of FIG. 8. Also diffraction images 22b, 23b, 24b and 25b of the rectangular light-transmission pattern 14 are formed in the x-direction and the y-direction of FIG. 8 in the same manner as the diffraction images (indicated by solid lines) 22a, 23a, 24a and 25a of the rectangular light-transmission pattern 13.

In the photomask 10, however, since the rectangular light-transmission pattern 14 is provided in a position deviating off the normal lines $N_1$ of the respective sides of the rectangular light-transmission pattern 13, the first-through third-order diffraction images 23a, 24a and 25a formed in the direction of the normal lines $N_1$ do not overlap the zero-order diffraction image 22b of the rectangular light-transmission pattern 14. Therefore, the image 22b of the rectangular light-transmission pattern 14 can be formed on the exposure surface 21 accurately without being affected by the diffraction light of the rectangular light-transmission pattern 13. The image 22a of the rectangular light-transmission pattern 13 can be also formed on the exposure surface 21 accurately without being affected by the diffraction light of the rectangular light-transmission pattern 14, similarly to the case of the rectangular light-transmission pattern 14.

In the above preferred embodiment, the rectangular light-transmission patterns 13 and 14 are disposed so that the normal lines $N_1$ and $N_2$ intersect at right angles. The intersection angle, however, is not limited to 90°. The similar effect can be obtained if the rectangular light-transmission pattern 14 is provided in a position deviating off the normal lines $N_1$ and the rectangular light-transmission pattern 13 is provided in a position deviating off the normal lines $N_2$.

Furthermore, the similar effect can be obtained in a photomask in which one or both of the rectangular light-transmission patterns 13 and 14 are filled with phase shift members for shifting the phase of transmission light.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A photomask, comprising:
   a transparent plate; and a shield layer formed on said transparent plate, said shield layer having a first and a second rectangular openings each of which serves as a rectangular light-transmission pattern, wherein said first rectangular opening is disposed so as to deviate off normal lines of respective sides of said second rectangular opening.

2. A photomask of claim 1, wherein said second rectangular opening is disposed so as to deviate off normal lines of respective sides of said first rectangular opening.

3. A photomask of claim 2, wherein the normal lines of the respective sides of said first rectangular opening intersect the normal lines of the respective sides of said second rectangular opening at right angles.

4. A photomask of claim 1, wherein said shield layer is made of chromium.

5. A photomask of claim 1, wherein said transparent plate is a glass plate.

6. A photomask of claim 1, said first and second openings is in the form of a square.

7. A photomask of claim 6, wherein a phase shift member is filled in said second rectangular opening, said phase shift member shifting the phase of light transmitted said second rectangular opening.

8. A photomask of claim 1, wherein a phase shift member is filled in said first rectangular opening, said phase shift member shifting the phase of light transmitted said first rectangular opening.

* * * * *